US009100011B1

(12) United States Patent
Lewis et al.

(10) Patent No.: US 9,100,011 B1
(45) Date of Patent: Aug. 4, 2015

(54) PIPELINED DIRECT DRIVE ROUTING FABRIC

(71) Applicant: ALTERA CORPORATION, San Jose, CA (US)

(72) Inventors: David Lewis, Toronto (CA); Valavan Manohararajah, Scarborough (CA); David Galloway, Toronto (CA); Tim Vanderhoek, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/594,832

(22) Filed: Jan. 12, 2015

Related U.S. Application Data

(63) Continuation of application No. 13/630,925, filed on Sep. 28, 2012, now Pat. No. 8,963,581.

(51) Int. Cl.
G06F 7/38 (2006.01)
H03K 19/173 (2006.01)
H03K 19/0944 (2006.01)

(52) U.S. Cl.
CPC ........ H03K 19/1737 (2013.01); H03K 19/0944 (2013.01)

(58) Field of Classification Search
CPC .......................... H03K 19/09429; H03K 3/027

USPC ............................ 326/37–41, 46–47, 56–58
See application file for complete search history.

(56) References Cited

U.S. PATENT DOCUMENTS

| 6,097,212 A * | 8/2000 | Agrawal et al. ................. 326/41 |
| 7,215,141 B2 * | 5/2007 | Lewis ............................. 326/41 |
| 8,536,896 B1 * | 9/2013 | Trimberger .................... 326/38 |
| 8,963,581 B1 * | 2/2015 | Lewis et al. .................... 326/40 |

* cited by examiner

Primary Examiner — Jason M Crawford
(74) Attorney, Agent, or Firm — Okamoto & Benedicto LLP

(57) ABSTRACT

One embodiment relates to a circuit for pipelined direct-drive routing, the circuit including a routing multiplexer, a flip-flop, and a mode multiplexer. The output of the routing multiplexer is coupled to an input of the mode multiplexer and to the flip-flop. The output of the flip-flop is connected to another input of the mode multiplexer. The flip-flop may be directly connected to the routing multiplexer and the mode multiplexer, or, in an alternate embodiment, the flip-flop may be a member of a pipeline register pool. Another embodiment relates to a circuit for pipelined direct-drive routing which uses a pulse latch. Other embodiments relate to method for pipelined direct-drive routing which includes a degree of logical separation between logic elements and flip-flop elements. Another embodiment relates to a logic array block. Other embodiments, aspects, and features are also disclosed.

15 Claims, 14 Drawing Sheets

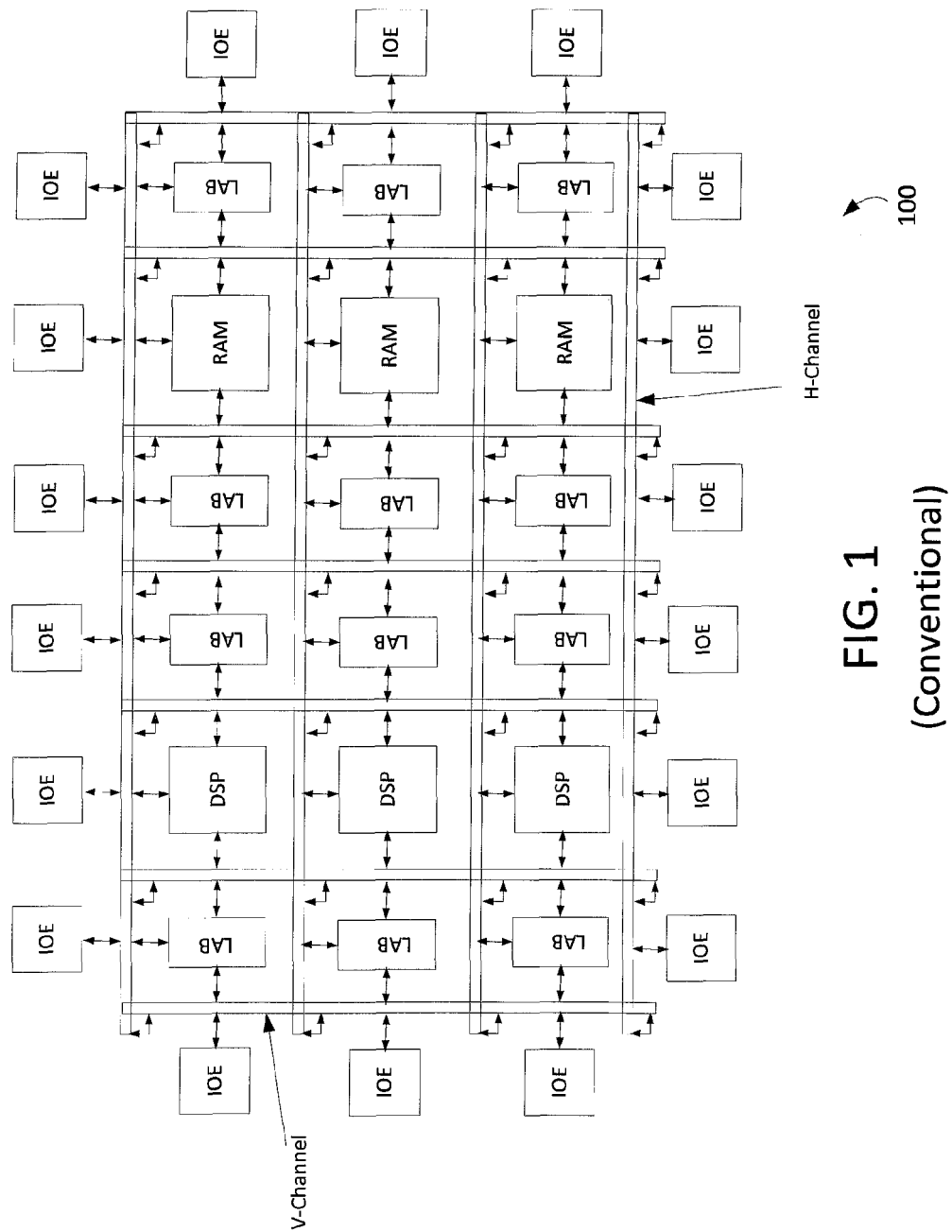
FIG. 1
(Conventional)

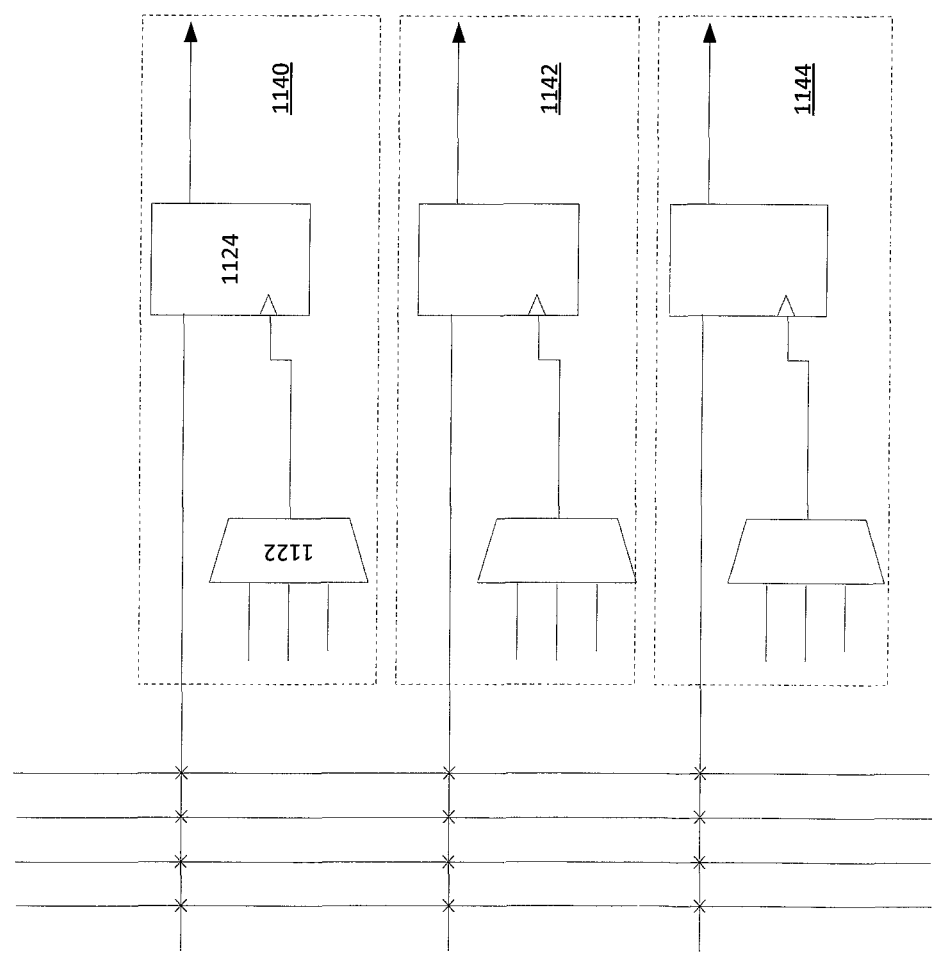

PIPELINED DIRECT DRIVE ROUTING FABRIC

CROSS-REFERENCE TO RELATED APPLICATION(S)

The present application is a continuation of U.S. patent application Ser. No. 13/630,925, filed Sep. 28, 2012, the disclosure of which is hereby incorporated by reference.

BACKGROUND

1. Technical Field

The present disclosure relates generally to integrated circuits and, in particular, to improved routing architectures for a programmable logic device.

2. Description of the Background Art

A programmable logic device ("PLD") is a digital, user-configurable integrated circuit used to implement a custom logic function. PLDs have found particularly wide application as a result of their combined low up front cost and versatility to the user. For the purposes of this description, the term PLD encompasses any digital logic circuit configured by the end-user, and includes a programmable logic array ("PLA"), a field programmable gate array ("FPGA"), and an erasable and complex PLD.

The basic building block of a PLD is a logic element that is capable of performing logic functions on a number of input variables. The logic elements of a PLD may be arranged in groups of, for example, eight to form a larger logic array block ("LAB").

Multiple LABs (and other functional blocks, such as memory blocks, digital signal processing blocks, and so on) are generally arranged in a two-dimensional array in a PLD core. The blocks may be separated by horizontal and vertical interconnect channels so as to form a two-dimensional array. Inputs and outputs of the LABs may be programmably connectable to horizontal and vertical interconnect channels.

A variety of PLD architectural approaches to arranging the interconnect array and logic elements have been developed. These approaches generally aim to optimize logic density and/or signal routability between the various logic elements.

SUMMARY

One embodiment relates to a circuit for pipelined direct-drive routing in a programmable logic device. The circuit may include a routing multiplexer, a flip-flop, and a mode multiplexer. The output of the routing multiplexer is coupled to the input of the flip-flop. The mode multiplexer has a first input connected to the output of the routing multiplexer and a second input coupled to the output of the flip-flop. The flip-flop may be directly connected to the routing multiplexer and the mode multiplexer, or, in an alternate embodiment, the flip-flop may be a member of a pipeline register pool.

Another embodiment relates to a method for pipelined direct-drive routing in a programmable logic device. A mode multiplexer is programmable logic device is programmed to a pipeline mode. A signal is selected by a routing multiplexer and output to a flip-flop. The flip-flop delays the signal and outputs the signal to the mode multiplexer. The signal is then output from the mode multiplexer to a driver circuit.

Another embodiment relates to a circuit for pipelined direct-drive routing which uses a pulse latch. The output of a routing multiplexer is connected to the input of the pulse latch, and the output of the pulse latch is coupled to an output line. The output of the pulse latch may drive the output line, or, in an alternate embodiment, the output of the pulse latch may be received by a driver which drives the output line.

Another embodiment relates to a method for pipelined direct-drive routing which uses a pulse latch. A latch control circuit may be programmed to a pipeline mode. The input of the pulse latch may be disabled before a control pulse is received, and a signal bit from a routing multiplexer may be received and delayed. Once the control pulse is received, the input of the pulse latch may be enabled, and the signal bit may be captured and output by the pulse latch. The pulse latch may drive the signal bit onto the output line or, in an alternative embodiment, may output the signal bit to a driver which drives the output line.

Another embodiment relates to a logic array block of a programmable logic device. The logic array block includes a plurality of driver input multiplexers (DIMs), a plurality of conductive lines, a plurality of logic-array-block input multiplexers (LIMB), a plurality of logic elements, a plurality of flip-flop elements, a first plurality of logic element input multiplexers (LEIMs), and a second plurality of LEIMs. Each LEIM in the first plurality may provide a signal from a conductive line in the logic array block to a logic element in the logic array block. Each LEIM in the second plurality may provide a signal from a conductive line in the logic array block to a flip-flop element in the logic array block.

Other embodiments, aspects, and features are also disclosed.

BRIEF DESCRIPTION OF THE DRAWINGS

FIG. 1 is an overview of an exemplary routing topology for a field programmable gate array (FPGA).

FIGS. 11A and 11B provide a logical view showing distinct logic and flip-flop resources in accordance with an embodiment of the invention.

DETAILED DESCRIPTION

As the die size of PLDs continues to increase, it becomes challenging for existing routing architectures to support a high speed across the die in an efficient manner. In order to support a high speed across the die, the present disclosure provides circuitry and methods for pipelining at a fine grain, down to the level of individual logic elements (LEs) and routing wires, if desired. The circuitry and methods disclosed herein may be applied to select regions of a programmable fabric or to all of the fabric.

FIG. 1 is an overview of an exemplary routing topology 100 for an FPGA. An embodiment of the present invention may be implemented within such a routing topology. Note that other routing wire topologies, besides the topology 100 depicted in FIG. 1, are intended to be included within the scope of the present invention. For example, the routing wire topology may include wires that do not exist completely within a single routing channel, such as wires that travel diagonally or that travel horizontally and vertically along different parts of their extent. Furthermore, it should be understood that embodiments of the present invention are not limited to being implemented in an FPGA and may be implemented in other integrated circuits with a programmable fabric.

As shown, the FPGA includes a two-dimensional array of functional blocks, including logic array blocks (LABs) and other functional blocks, such as random access memory (RAM) blocks and digital signal processing (DSP) blocks, for example. The FPGA also includes programmable interconnect in the form of horizontal and vertical channels, each channel including one or more routing wires. In addition, input/output elements (IOEs) may be located around the periphery of the chip.

Routing wires are typically shorter than the entire length of the channel. A length n wire spans n functional blocks. For example, a length 4 wire spans 4 blocks. Length 4 wires are referred to as H4 wires in a horizontal channel and V4 wires in a vertical channel.

In a direct drive routing architecture, each wire is driven at a single logical point by a driver. In most cases, the driver is associated with a multiplexer which selects a signal to drive on the wire. In the case of channels with a fixed number of wires along their length, a driver may be placed at each starting point of a wire.

Different routing architectures may have LABs which connect to different numbers of routing channels. A three-sided routing architecture is depicted in FIG. 1 due to there being bi-directional connections on three sides of each functional unit to the routing channels. Other routing architectures are also intended to be included within the scope of the present invention. Examples of other routing architectures include 1-sided, 1½-sided, 2-sided, and 4-sided routing architectures.

Pipelined Routing Multiplexer

Figure 2:
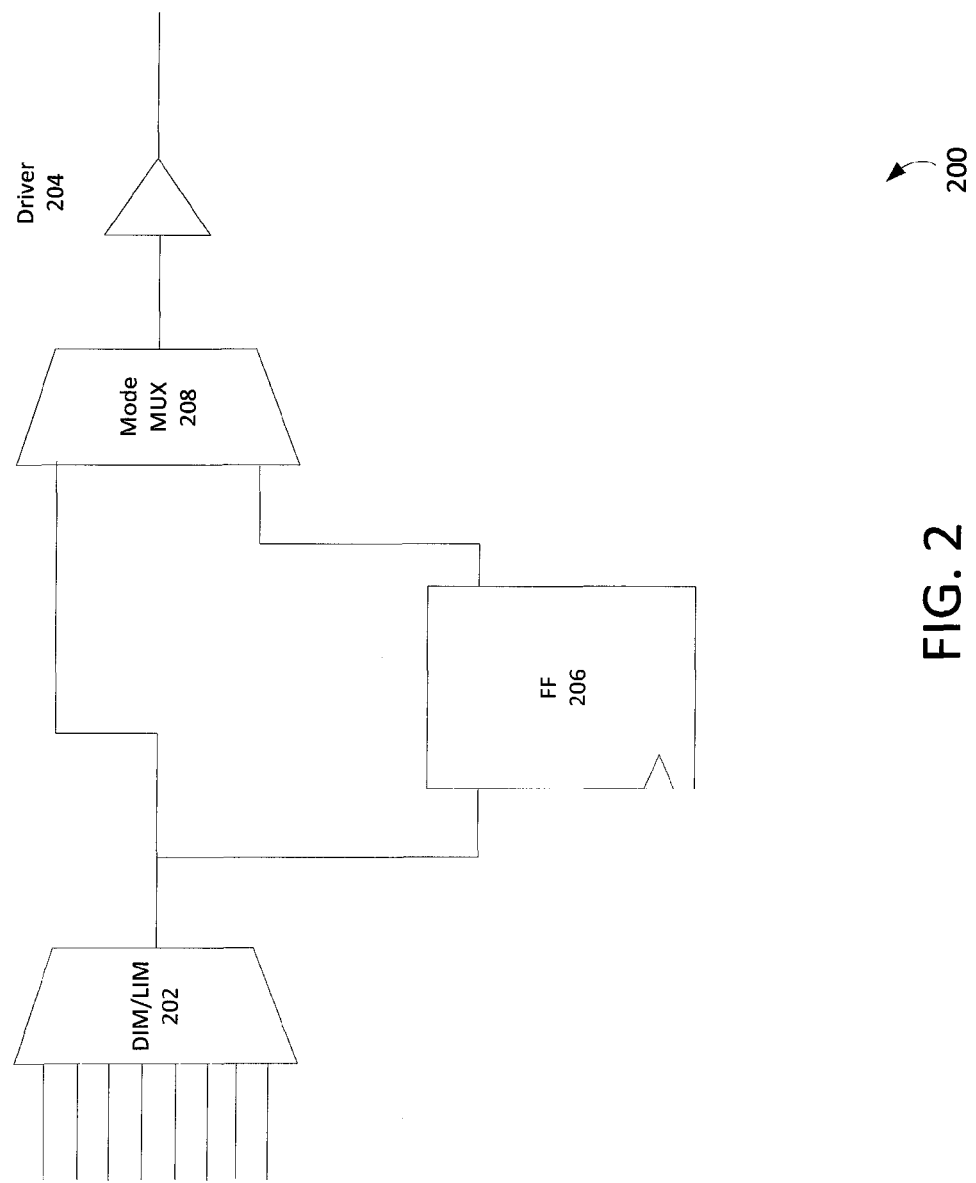
FIG. 2 depicts a pipelined routing multiplexer which uses a flip-flop in accordance with an embodiment of the invention.

FIG. 2 depicts a pipelined routing multiplexer 200 which uses a flip-flop in accordance with an embodiment of the invention. As shown, the pipelined routing multiplexer 200 includes a conventional routing multiplexer (DIM/LIM) 202 and a driver 204 and adds a flip-flop (FF) circuit 206 and a second multiplexer 208.

The routing multiplexer (DIM/LIM) 202 may be a driver input multiplexer (DIM) or a LAB input multiplexer (LIM). A DIM drives a routing wire and can typically select from multiple sources that can drive the wire. The multiple sources may include signals from outputs of LABs and other routing wires that travel in the same or in an orthogonal direction to the wire. A LIM outputs a signal to a LAB and can typically select the signal from multiple routing wires. In a conventional direct drive circuit, the output of the DIM/LIM is typically provided directly to the driver circuit 204.

As shown in FIG. 2, in accordance with an embodiment of the invention, the DIM/LIM 202 may be pipelined by providing its output to the data input of the FF 206. A mode multiplexer (MUX) 208 in the pipelined routing multiplexer 200 receives the output of the DIM/LIM 202 directly and also receives the data output from the FF 206. The mode MUX 208 allows the pipelined routing multiplexer 200 to be either used in a conventional (non-pipeline) mode or in a pipeline register mode. In the non-pipeline mode, the output of the mode MUX 208 selects the direct output of the DIM/LIM 202. In the pipeline mode, the mode MUX 208 selects the output from the FF 206. The mode MUX 208 provides its output to the driver circuit 204, and the output of the driver circuit 204 is used to drive a routing wire (for a DIM) or a LAB line (for a LIM).

It is possible to provide a FF with each DIM/LIM such that all the routing multiplexers are pipelined. However, that may be unnecessary in practice as the capabilities provided may exceed typical design requirements. It is contemplated that, more typically, some fraction, such as one-half or one-fourth, of the routing multiplexers may be pipelined. For example, in a typical architecture a wire might take 150 picoseconds (ps) to traverse, but it is only necessary to operate with a 650 ps clock cycle, so registering every fourth wire would be sufficient.

In a typical implementation, the pipelined wires may be placed in a periodic manner. For instance, some fixed number of conventional DIMs may be followed by a pipelined DIM (PDIM) in a periodic manner. Consider, for example, a routing architecture with 320 H wires and 160 V wires, each of length 4, and a total of 80 drivers per LAB. In order to register one-fourth of the wires, it would be necessary to provide 320/4/4 PDIMs=20 PDIMs for the H wires and 160/4/4 PDIMs=10 PDIMs for the V wires in each LAB. Note that the fraction of wires pipelined may vary for different wire types; for example, if V wires take 300 ps to traverse, it would be desirable to pipeline one-half of them to meet a 650 ps timing budget.

Figure 3:
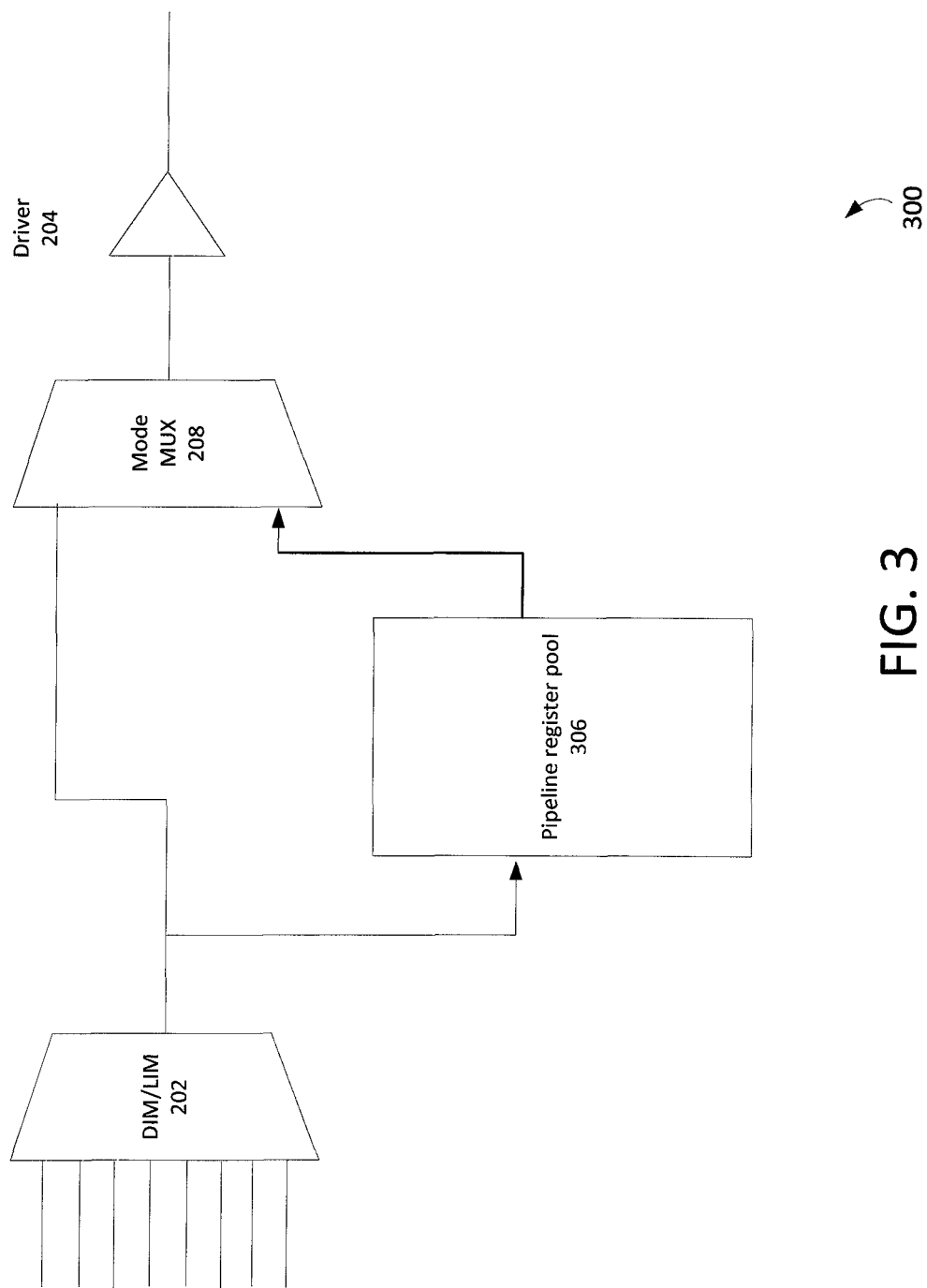
FIG. 3 depicts a pipelined routing multiplexer which uses a pipeline register pool in accordance with an embodiment of the invention.

While FIG. 2 shows an embodiment that integrates a FF 206 with an individual DIM/LIM 202, FIG. 3 depicts an embodiment where an individual DIM/LIM 202 may use a register from a common pool of pipeline registers 306. In accordance with this embodiment, the common pool of pipeline registers may be shared in a selective manner by some set of DIM/LIMs. In other words, each DIM/LIM 202 that is to be made capable of pipelining is arranged to provide an output to the pipeline register pool 306, and receives an output from the pool 306 to its mode MUX 208.

Figure 4:
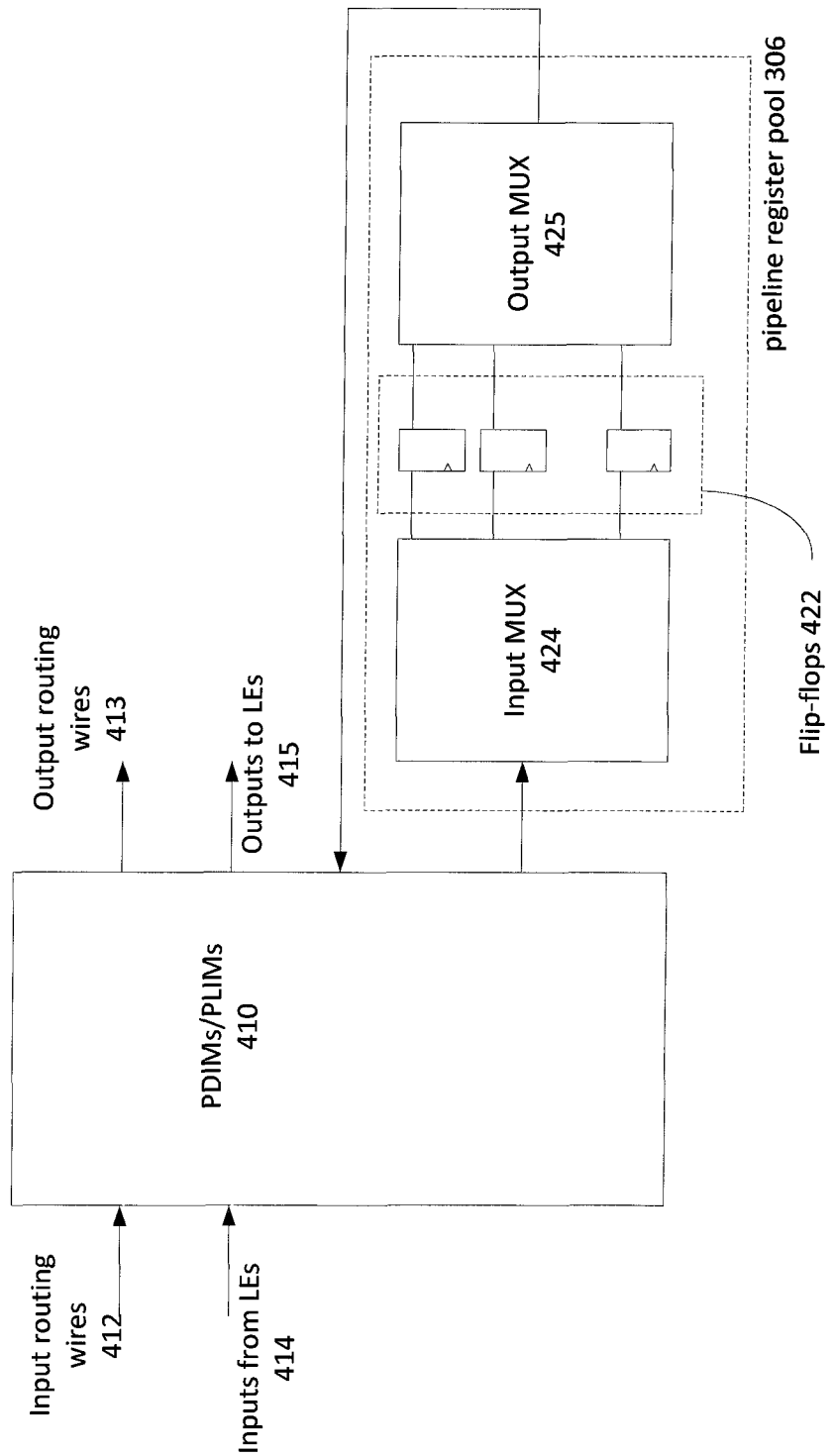
FIG. 4 depicts a pipeline register pool connecting to DIMs and/or LIMs in accordance with an embodiment of the invention.

An exemplary structure for the pipeline register pool 306 is shown in FIG. 4 in accordance with an embodiment of the invention. As shown, the pipeline register pool 306 includes an array of flip-flops 422, an input multiplexer (input MUX) 424, and an output MUX 426.

The input MUX 424 and the output MUX 426 may be connected to a set of pipelined DIMs or LIMs (PDIMs/PLIMs) 410. In particular, the output of routing multiplexers (DIM/LIM) 202 of the PDIMs/PLIMs 410 may be connected to the input MUX 424, and the output MUX 426 may be connected to inputs of corresponding mode multiplexers 208 of the PDIMs/PLIMs 410.

As further depicted, the PDIMs of the PDIMs/PLIMs 410 receive signals from incoming routing wires 412 and provide the signals to the outgoing routing wires 413. Similarly, the PLIMs of the PDIMs/PLIMs 410 receive inputs from LEs 414 and provide outputs to LEs 415.

Figure 5:
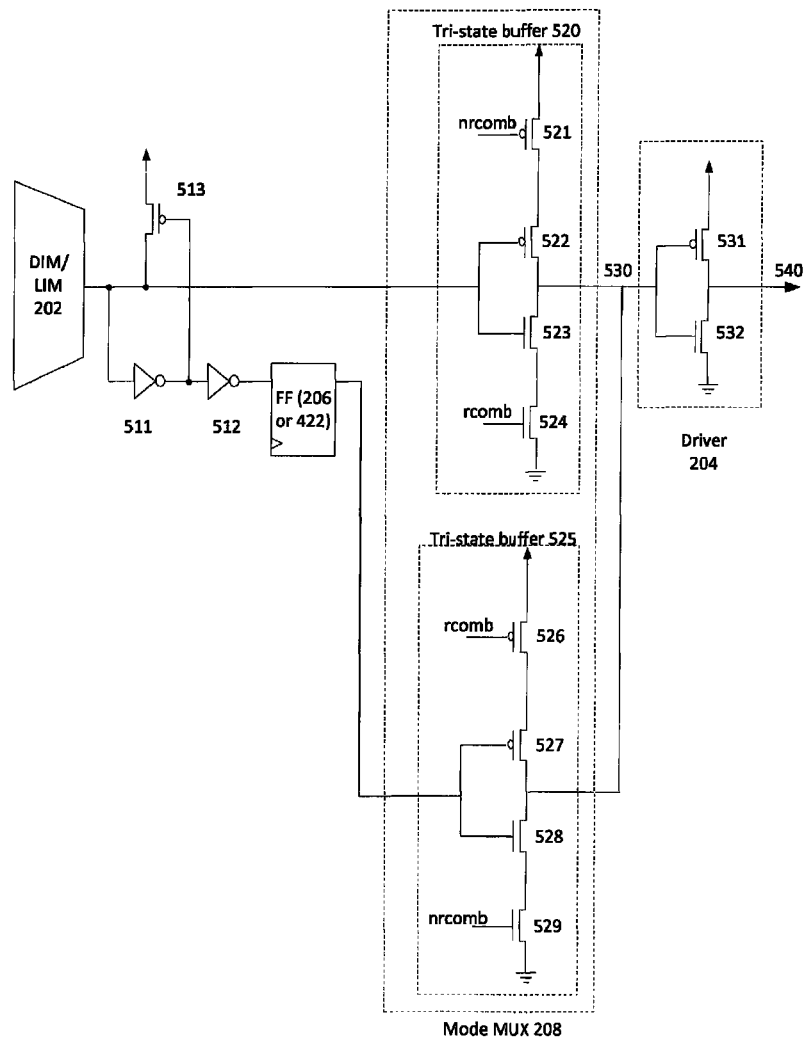
FIG. 5 is a circuit diagram of a pipelined routing multiplexer (PDIM/PLIM) in accordance with an embodiment of the invention.

FIG. 5 is a circuit diagram of a pipelined routing multiplexer 500 in accordance with an embodiment of the invention. This circuit diagram includes an exemplary circuit implementation for the mode MUX 208. Other implementations such as NMOS or CMOS muxes are also contemplated to be within the scope of the invention.

Note that, if the routing multiplexer 202 is an NMOS pass gate multiplexer, then, as shown in FIG. 5, the output of DIM/LIM 202 is connected to the input of a first inverter 511 and the drain of PMOS transistor 513. The source of PMOS transistor 513 is connected to a supply voltage. The gate of the PMOS transistor 513 is coupled to a node between the output of the first inverter 511 and the input of a second inverter 512. The output of the second inverter 512 is provided to the flip-flop 206 in the embodiment of FIG. 2 (or the pipeline register pool 306 in the embodiment of FIG. 3).

As depicted in FIG. 5, the mode MUX 208 may include two tri-state buffers. The first tri-state buffer 520 is connected to the output of the DIM/LIM 202, while the second tri-state buffer 525 is connected to the output of the flip-flop 206 (or pipeline register pool 306). The outputs of both tri-state buffers are connected to intermediate node 530 which is connected to the input of the driver 204.

The first tri-state buffer 520 may be implemented as a CMOS circuit with four transistors in series: PMOS transistor 521; PMOS transistor 522; NMOS transistor 523; and NMOS transistor 524. The source of PMOS transistor 521 is connected to a supply voltage, while the source of NMOS transistor 524 is connected to ground. The drain of PMOS transistor 521 is connected to the source of PMOS transistor 522, and the drain of NMOS transistor 524 is connected to the source of NMOS transistor 523. The drains and gates PMOS transistor 522 and NMOS transistor 523 are connected to each other. The input node between the gates of PMOS transistor 522 and NMOS transistor 523 is connected to the output of the DIM/LIM 202. The drains of PMOS transistor 522 and NMOS transistor 523 are connected to the intermediate node 530. The gate of NMOS transistor 524 receives control signal rcomb, while the gate of PMOS transistor 521 receives the inverse control signal nrcomb (where nrcomb is the inverse of rcomb).

The second tri-state buffer 525 may also be implemented as a CMOS circuit with four transistors in series: PMOS transistor 526; PMOS transistor 527; NMOS transistor 528; and NMOS transistor 529. The source of PMOS transistor 526 is connected to a supply voltage, while the source of NMOS transistor 529 is connected to ground. The drain of PMOS transistor 526 is connected to the source of PMOS transistor 527, and the drain of NMOS transistor 529 is connected to the source of NMOS transistor 528. The drains and gates PMOS transistor 527 and NMOS transistor 528 are connected to each other. The input node between the gates of PMOS transistor 527 and NMOS transistor 528 is connected to the output of the flip-flop 206 (or pipeline register pool 306). The drains of PMOS transistor 527 and NMOS transistor 528 are connected to intermediate node 530. The gate of PMOS transistor 526 receives control signal rcomb, while the gate of NMOS transistor 529 receives the inverse control signal nrcomb.

The driver 204 may be implemented as a CMOS inverter which includes PMOS transistor 531 and NMOS transistor 532 in series. The source of PMOS transistor 531 is connected to a supply voltage, while the source of NMOS transistor 532 is connected to ground. The gates and drains of PMOS transistor 531 and NMOS transistor 532 are connected together to form the input node and the output node, respectively. The input node is connected to intermediate node 530. The output node is connected to the output line 540 (which is the routing wire or LAB line to be driven).

Figure 6:
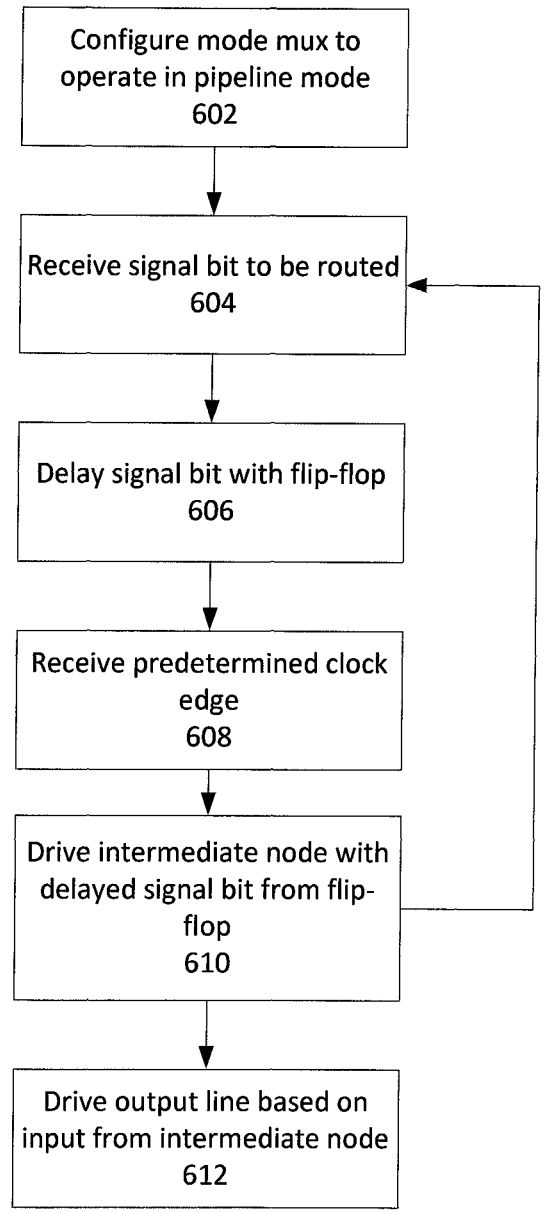
FIG. 6 is a flow chart depicting a method for pipelined direct-drive routing using a PDIM/PLIM in accordance with an embodiment of the invention.

FIG. 6 is a flow chart depicting a method 600 for pipelined direct-drive routing in a programmable logic device in accordance with an embodiment of the invention. The method 600 of FIG. 6 may be implemented using pipelined routing multiplexers such as the pipelined routing multiplexer 500 described above in relation to FIG. 5, for example.

In block 602, a mode multiplexer 208 may be configured to operate in a pipeline mode. Such a step would apply in an embodiment where the pipelined routing multiplexer 500 is designed to be usable in either a conventional (non-pipeline) mode or a pipeline mode. This configuring step may be performed during the electronic programming of the programmable logic device. In the pipelined routing multiplexer 500 of FIG. 5, the pipeline mode is configured by resetting the rcomb signal to a low state. In the pipeline mode, the first tri-state buffer 530 is in its high-impedance state, and the second tri-state buffer 525 drives the output node. (Alternatively, the non-pipeline mode may be configured by setting the rcomb signal to a high state. In the non-pipeline mode, the first tri-state buffer drives the output node 530, and the second tri-state buffer 525 is in its high-impedance state.)

In block 604, a signal bit to be routed is received from the routing multiplexer 202 and delayed by a flip-flop (206 or 422). In FIG. 5, the signal bit is transferred through the two inverters 511 and 512 in series to the flip-flop (206 or 422). Per block 606, the flip-flop (206 or 422) delays the signal bit by a time that is less than a clock cycle.

In block 608, a predetermined clock edge is received at a clock input of the flip-flop (206 or 422). Per block 610, this causes the flip-flop (206 or 422) to output the signal bit to the second tri-state buffer 525 of mode multiplexer 208. Since the mode multiplexer 208 is configured to operate in the pipeline mode, the second tri-state buffer 525 of the mode multiplexer 208 drives the intermediate node 530 using the delayed signal bit. Consequently, per block 612, the delayed signal bit is driven onto output line 540 by the driver 204 based on the input from the intermediate node 530.

As shown in FIG. 6, after block 610, the method 600 may loop back to block 604. As described above, a next signal bit to be routed is received per block 604 and delayed per block 606, until a predetermined clock edge is received per block 608 and a delayed version of the signal bit is driven to the intermediate node per block 610, and the output line is driven based on the input from the intermediate node per block 612.

Figure 7:
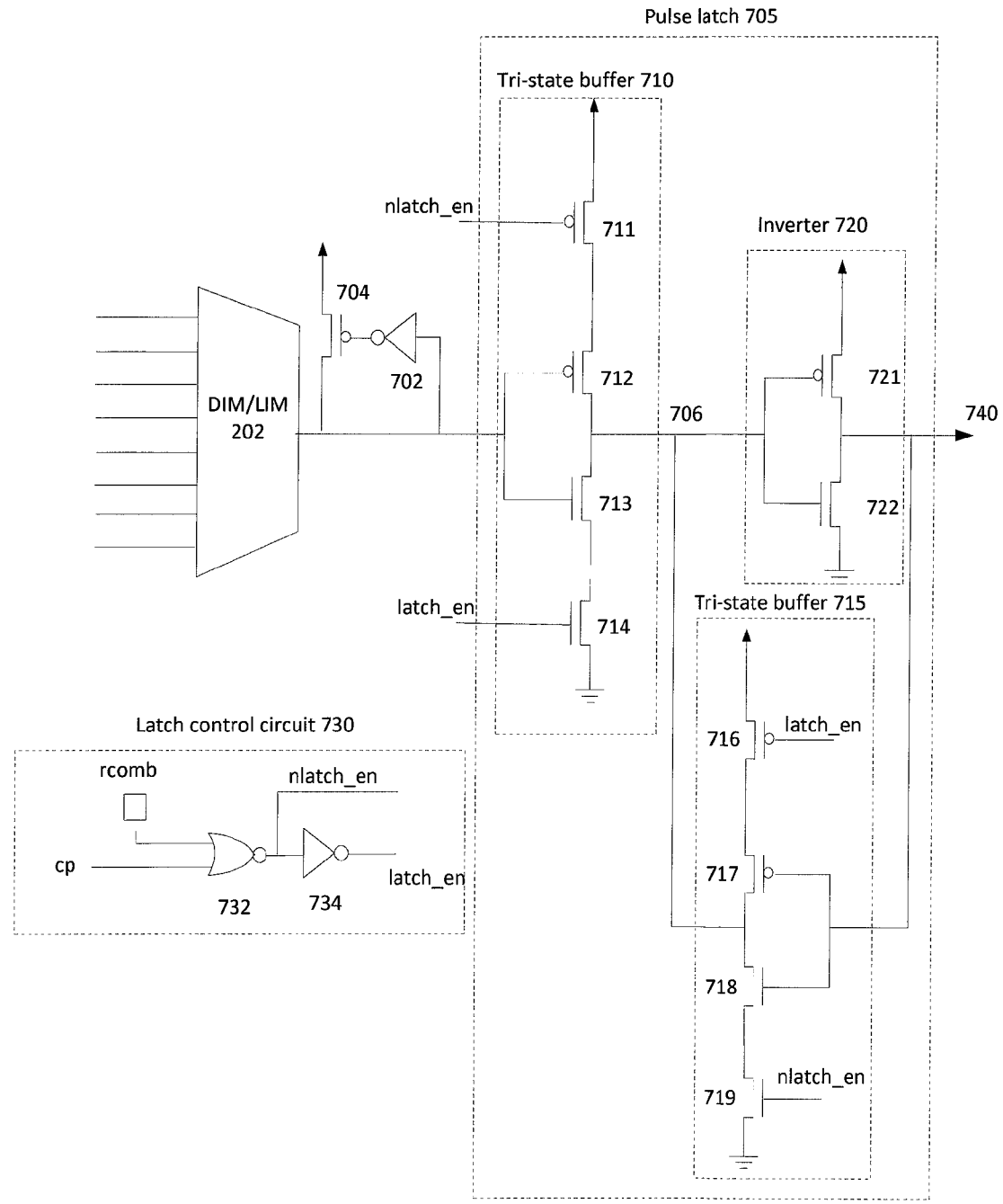
FIG. 7 is a circuit diagram of a PDIM/PLIM with a pulse latch in accordance with an embodiment of the invention.

FIG. 7 is a circuit diagram of a pipelined routing multiplexer 600 which uses a pulse latch in accordance with an embodiment of the invention. In this embodiment, it may be considered that the pulse latch 705 of FIG. 7 combines the functionalities of the flip-flop 206, the mode MUX 208, and the driver 204 of FIG. 2.

Note that, as shown in FIG. 7, the output of DIM/LIM 202 is connected to the input of inverter 702 and the drain of PMOS transistor 704. The source of PMOS transistor 704 is connected to a supply voltage. The gate of the PMOS transistor 704 is connected to the output of inverter 702.

As depicted in FIG. 7, the pulse latch 705 may be formed using two tri-state buffers (710 and 715) and an inverter 720. The input of the first tri-state buffer 710 is connected to the output of the DIM/LIM 202. The input of the inverter 720 is connected at storage node 706 to the outputs of both the first tri-state buffer 710 and the second tri-state buffer 715. The output of the inverter 720 is connected to the input of the second tri-state buffer 715 and also to the output line 740, where the output line 740 is the routing wire (for a DIM) or LAB line (for a LIM) that is being driven by the pipelined routing multiplexer 600.

The first tri-state buffer 710 may be implemented as a CMOS circuit with four transistors in series: PMOS transistor 711; PMOS transistor 712; NMOS transistor 713; and NMOS transistor 714. The source of PMOS transistor 711 is connected to a supply voltage, while the source of NMOS transistor 714 is connected to ground. The drain of PMOS transistor 711 is connected to the source of PMOS transistor 712, and the drain of NMOS transistor 714 is connected to the source of NMOS transistor 713. The gates and drains PMOS transistor 712 and NMOS transistor 713 are connected to each other to form the input node and the output node, respectively. The input node is connected to the output of the DIM/LIM 202, and the output node is connected to the storage node 706. The gate of NMOS transistor 714 receives pulsed control signal latch_en, while the gate of PMOS transistor 711 receives the inverse pulsed control signal nlatch_en (where nlatch_en is the inverse of latch_en).

The second tri-state buffer 715 also may be implemented as a CMOS circuit with four transistors in series: PMOS transistor 716; PMOS transistor 717; NMOS transistor 718; and NMOS transistor 719. The source of PMOS transistor 716 is connected to a supply voltage, while the source of NMOS transistor 719 is connected to ground. The drain of PMOS transistor 716 is connected to the source of PMOS transistor 717, and the drain of NMOS transistor 719 is connected to the source of NMOS transistor 718. The gates and drains PMOS transistor 712 and NMOS transistor 713 are connected to each other to form the input node and the output node, respectively. The input node is connected to the output of the inverter 620, and the output node is connected to the storage node 706. The gate of PMOS transistor 719 receives pulsed control signal latch_en, while the gate of NMOS transistor 716 receives the inverse pulsed control signal nlatch_en.

The inverter 720 may be implemented as a CMOS inverter which includes PMOS transistor 721 and NMOS transistor 722 in series. The source of PMOS transistor 721 is connected to a supply voltage, while the source of NMOS transistor 722 is connected to ground. The gates and drains of PMOS transistor 721 and NMOS transistor 722 are connected together to form the input node and output node, respectively. The input node is connected to the storage node 706. The output node is connected to both the input of the second tri-state buffer 715 and to the output line 740.

The control signals may be generated using a latch control circuit 730. As depicted, the latch control circuit 730 may include a NOR gate 732 and an inverter 734 in series. The NOR gate 732 may receive control signal rcomb at a first input and pulsed clock cp at a second input. The output of the NOR gate 732 is connected to the input of the inverter 734. The inverter 734 outputs the latch enable signal latch_en, while the inverse latch enable signal nlatch_en may be obtained from the output of the NOR gate 732.

Figure 8:
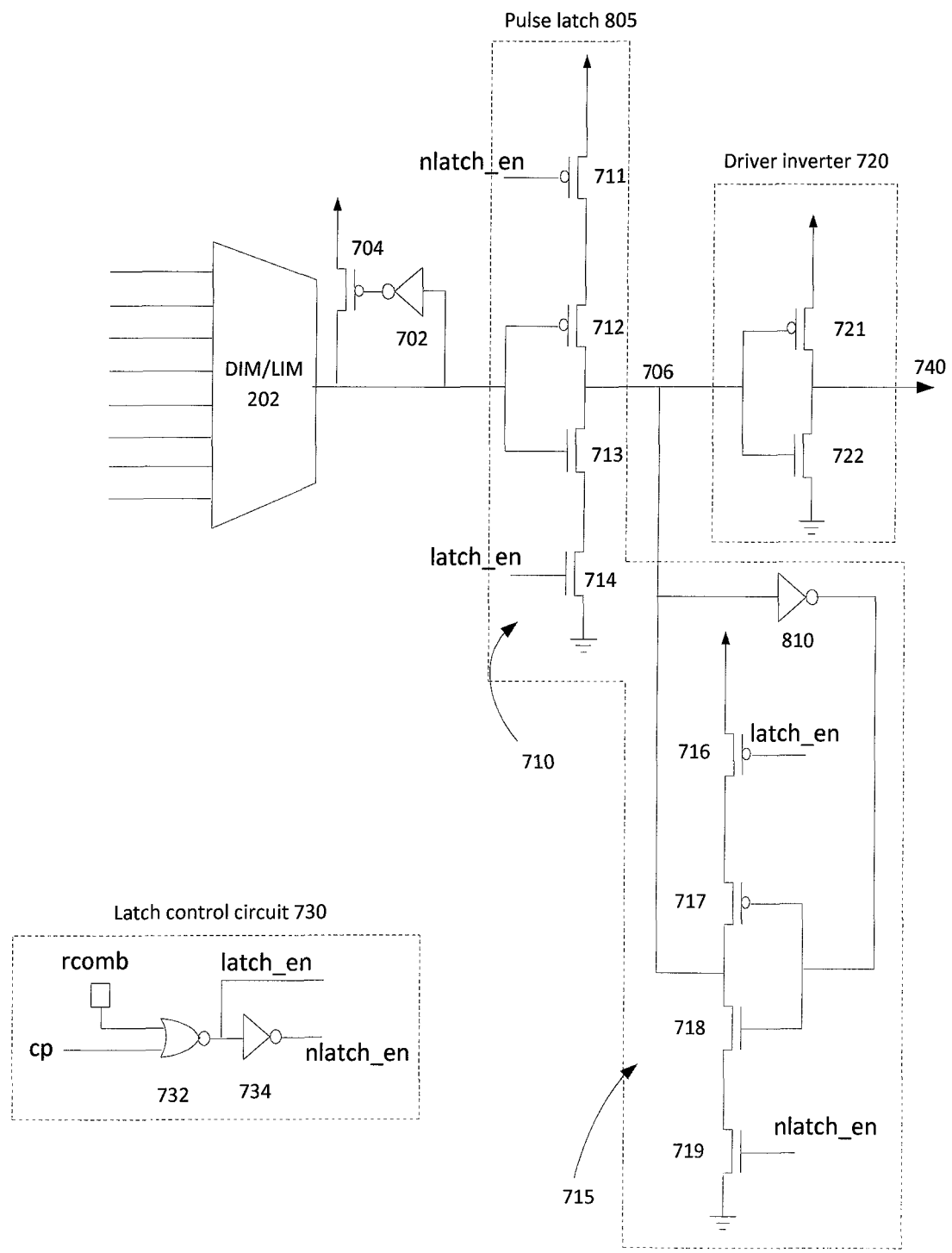
FIG. 8 is a circuit diagram of a PDIM/PLIM with a pulse latch that has a separate feed-forward inverter in accordance with an embodiment of the invention.

FIG. 8 is a circuit diagram of a pipelined routing multiplexer 800 which uses a pulse latch 805 with a separate feed-forward inverter 810 in accordance with an embodiment of the invention. In this embodiment, the output of the driver inverter 720 is connected to the output line 740, but it is not connected to the input of the second tri-state buffer 715. Instead, the separate feed-forward inverter 810 has its output connected to the input of the second tri-state buffer 715. The inputs of the driver inverter 720 and separate feed-forward inverter 810 are each connected to the storage node 706. This embodiment reduces the pulse width necessary to activate the latching function of the pulse latch.

Figure 9:
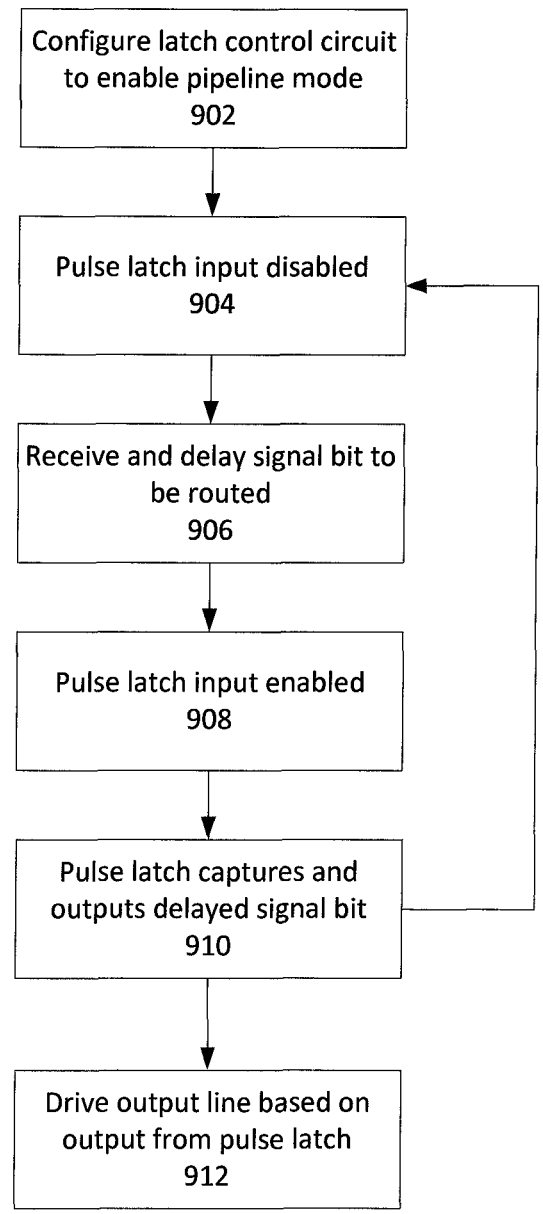
FIG. 9 is a flow chart depicting a method for pipelined direct-drive routing using a PDIM/PLIM with a pulse latch in accordance with an embodiment of the invention.

FIG. 9 is a flow chart depicting a method 900 for pipelined direct-drive routing in a programmable logic device in accordance with another embodiment of the invention. The method 900 of FIG. 9 may be implemented using pipelined routing multiplexers such as the pipelined routing multiplexer 700 described above in relation to FIG. 7, for example.

In block 902, a latch control circuit 730 may be configured to enable a pipeline mode. Such a step would apply in an embodiment where the pipelined routing multiplexer 700 is designed to be usable in either a conventional (non-pipeline) mode or a pipeline mode. This configuring step may be performed during the electronic programming of the programmable logic device. In the pipelined routing multiplexer 700 of FIG. 7, the pipeline mode is configured by resetting the rcomb signal to a low state. (Alternatively, a non-pipeline mode may be configured by setting the rcomb signal to a high state. In this non-pipeline mode, the input to the pulse latch 705 is always enabled such that the signal bit is not registered.) At this point, per block 904, the input of the pulse latch 705 is disabled.

In FIG. 7, this may be accomplished by the pulsed clock cp signal being reset to a low state such that latch_en is de-asserted. The de-assertion of latch_en disables the input to the pulse latch 705. In particular, the de-assertion of latch_en causes the first tri-state buffer 710 to be in its high-impedance state while the second tri-state buffer 715 drives the storage node 706 (and hence the output of the pulse latch 705).

In block 906, a signal bit to be routed is received and delayed by the pulse latch 705 from the routing multiplexer 202. In FIG. 7, the signal bit is received by the first tri-state buffer 710 of the pulse latch 705. However, while the input of the pulse latch 705 is disabled, the signal bit is delayed from being output by the pulse latch 705.

In block 908, the input of the pulse latch 705 is enabled. In FIG. 7, this may be accomplished by the pulsed clock cp signal being set to a high state such that latch_en is asserted. The assertion of latch_en enables the input to the pulse latch 705.

In block 910, the pulse latch 705 captures and outputs the delayed signal bit. In FIG. 7, this is accomplished because the assertion of latch_en causes the first tri-state buffer 710 to drive the storage node 706 with the signal bit while the second tri-state buffer 715 is in its high-impedance state. Consequently, the delayed signal bit from the pulse latch 705 is driven onto the output line 740 by the inverter 720 per block 912.

As shown in FIG. 9, after block 910, the method 900 may loop back to block 904. As described above, the input to the pulse latch 705 is disabled when the pulse ends in block 904 (i.e. when the pulsed clock cp signal is reset to a low state such that latch_en is de-asserted). Thereafter, a next signal bit to be routed is received and delayed per block 906, until a next pulse is received such that the pulse latch 705 is enabled per block 908. A delayed version of the signal bit is then captured and driven onto the output line 740 per blocks 910 and 912.

Logical and Physical Implementations

In order to ensure adequate flexibility for a computer-aided design tool to use pipeline registers effectively, it is advantageous to logically decouple the pipeline registers from the logic functions in a LAB. In the case of a PDIM/PLIM which incorporates a flip-flop for use as the pipeline register, each PDIM/PLIM is independent from the logic functions such that pipelining can always be performed if so configured.

In the case of a PDIM/PLIM which uses a flip-flop from a pipeline register pool, the FFs in the pipeline registers are independent from the FFs in the logic elements and are used solely for pipeline routing. Hence, the pipeline register input MUX and the pipeline register output MUX need to be sufficiently flexible to have a high probability of successfully routing the desired pipelined signals.

In an embodiment with a small number of pipeline registers, a full crossbar may be provided in both the pipeline register input MUX and the pipeline register output MUX. Since in typical applications the pipeline registers will be logically identical, there is typically no need to route a specific wire to a specific pipeline register. Hence, a less-expensive perfect crossbar may be used, such that if there are N inputs and outputs to the pipeline register pool and M registers in the pool, then both the input and output MUXes may be of size (N−M+1). The degenerate case of N=M results in 1:1 MUXes, in other words, wires.

In an embodiment where N is larger than M, a multi-level interconnection network may be provided. The network may be, for example, a Clos network, or a two-level network such as the LIM and LEIM structure described below.

It may also be desirable to support lower degrees of pipelining by providing registers in the LAB that are largely decoupled from the logic fabric. For low degrees of pipelining, a much smaller number of registers may be used and longer delays may be tolerated between the routing and pipeline registers.

Figure 10:
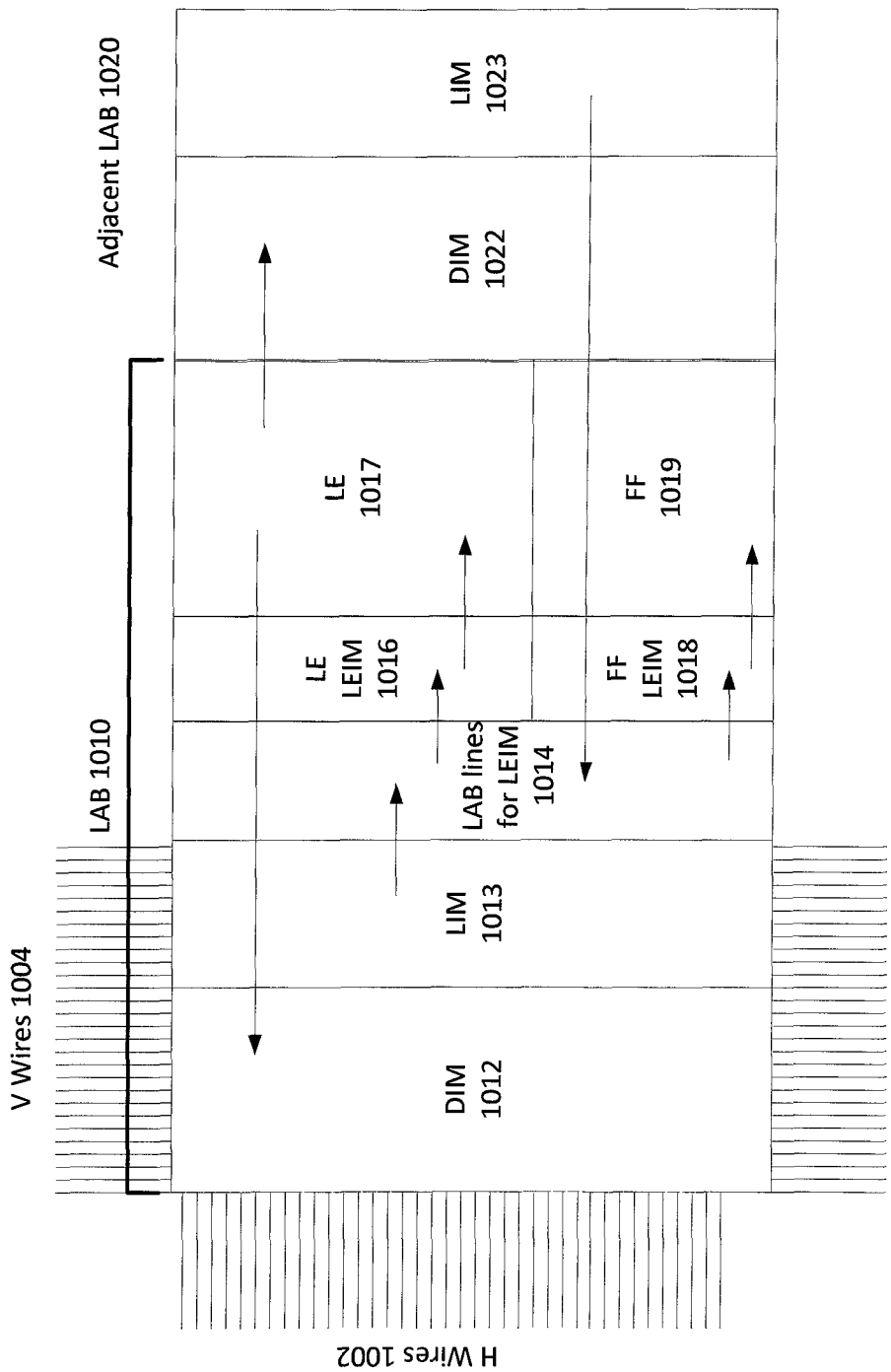
FIG. 10 shows a physical layout of a logic array block in accordance with an embodiment of the invention.

For example, to ensure routability and to avoid providing unneeded connectivity to the extra registers, a LAB may be physically implemented as shown in FIG. 10. As shown, the LAB 1010 includes routing, logic and register portions.

The routing portion include DIMs in section 1012, LIMs in section 1013, LAB lines (for connecting to the LEIMs) in section 1014, LEIMs for connecting to LEs in section 1016, and LEIMs for connecting to FF elements in section 1018. The logic portion includes logic elements in section 1017, and the register portion includes FF elements in section 1019.

H wires 1002 of a horizontal channel may be arranged to run on metal layers over the LABs in the horizontal strip of logic, and a vertical channel of V wires 1004 may be arranged to run on metal layers over each LAB. The DIMs 1012 and LIMs 1013 of the LAB 1010 may be arranged to connect to the H wires 1002 and V wires 1004.

As shown in FIG. 10, signals from the LIM section 1013 in the LAB 1010 (and signals from the LIM section 1023 in the adjacent LAB 1020) may be output to the LAB lines 1014. The LAB lines 1014 may output signals to the multiplexers in the LE LEIM 1016 and FF LEIM 1018 sections. The LE LEIM section 1016 may output signals to the LE section 1017, and the FF LEIM section 1017 may output signals to the FF section 1019. As further shown, the LE section 1017 may output signals to the DIM section 1012 of the LAB 1010 (and to the DIM section 1022 of the adjacent LAB 1020).

In accordance with an embodiment of the invention, the FF section 1019 in the LAB 1010 may be similar to the pipeline register pool 306 previously described. The FF elements in FF section 1019 may have direct inputs from a subset of the LAB lines 1018 that is not shared with the logic elements in LE section 1017. In other words, one subset of LAB lines 1014 may connect to both LE and FF LEIMs, one subset of LAB lines 1016 may be used to connect to the LE LEIMs, and a different subset of LAB lines 1018 may be used to connect to the FF LEIMs. Thus, the FF elements in FF section 1019 have a degree of logical independence from the logic elements in LE section 1017. The logical independence makes it possible to perform placement and routing of the FF elements in FF section 1019 independently from the logic elements in LE section 1017.

Furthermore, since the FF elements in FF section 1019 do not necessarily share inputs with the logic elements in LE section 1017, providing at least some independent LAB lines avoids wasting hardware cost by also connecting these inputs to the LEIM associated with the LEs. While existing architectures generally use output multiplexing to share a LE output between LUT and FF, it is desirable to provide separate outputs for FFs that can be used for pipelined routing in order to increase the decoupling of logic and pipeline registers.

Figure 11A:
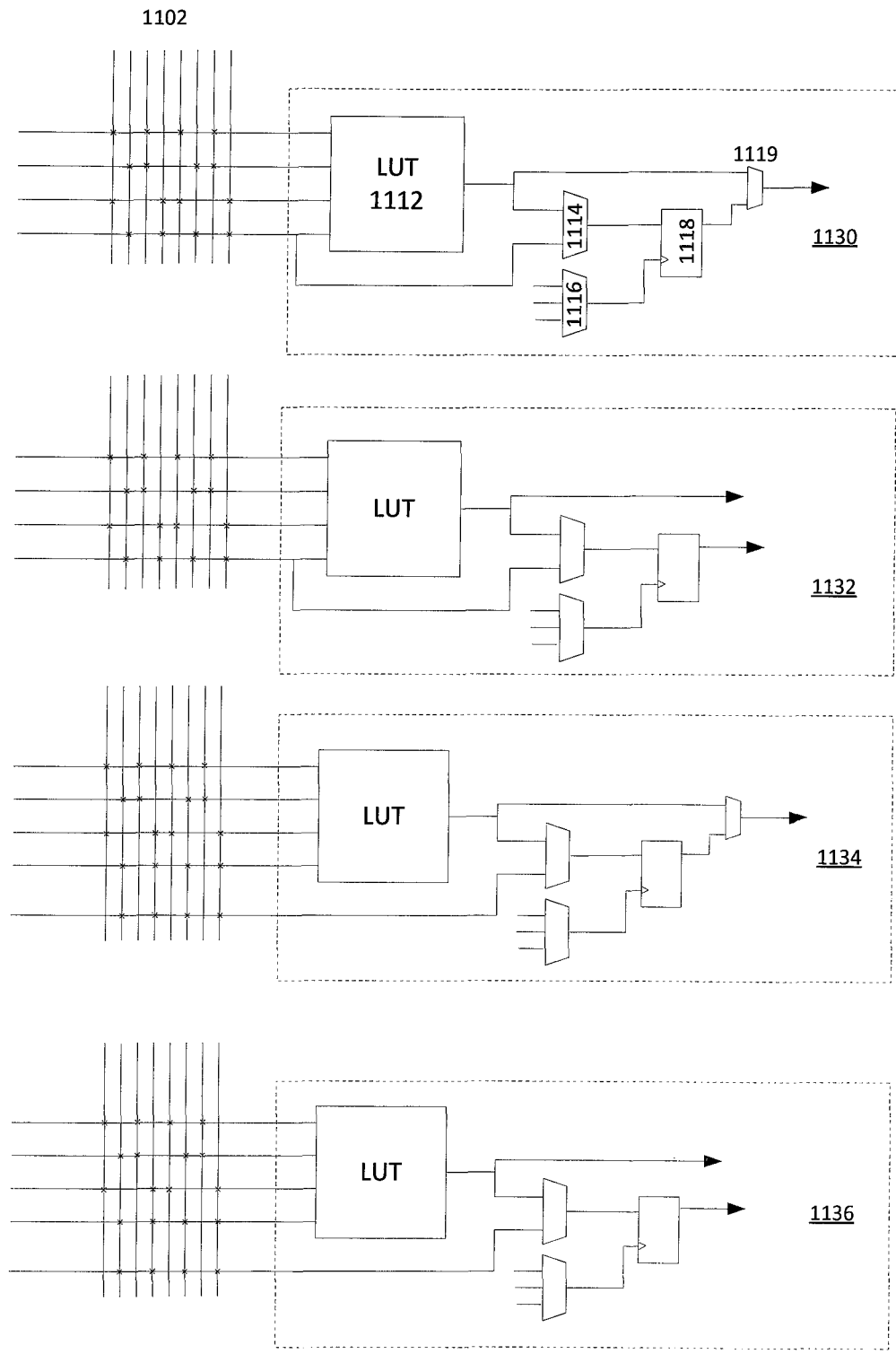

The logical decoupling between distinct logic elements (LEs) and flip-flop (FF) elements is depicted by an exemplary logical view shown in FIGS. 11A and 11B. As shown in the logical view of FIG. 11A, a first set of LAB lines 1102 may be connected to LEs (1130, 1132, 1134 and 1136) of the LAB. As shown there are variations of input connectivity which may be different for each LE. Meanwhile, as shown in the logical view of FIG. 11B, a second set of LAB lines 1104 may be connected to FF elements (1140, 1142 and 1144) of the LAB.

As depicted in FIG. 11A, each LE (1130, 1132, 1134 and 1136) may include, for example, LUT 1112, FF 1118, MUXes 1114 and 1119, and clock MUX 1116. The LUT 1112 may be connected to the LAB lines 1102. MUX 1114 may receive inputs from the output of LUT 1112 and directly from a LAB line 1102. FF 1118 may receive a data input from MUX 1114 and a clock input from clock MUX 1116. MUX 1119 may receive inputs from LUT 1112 and from FF 1118. As depicted in FIG. 11B, each FF element 1120 may include, for example, a FF 1124 and a clock MUX 1122. The clock MUX 1122 may be connected to the clock input of the FF 1124.

Figure 12:
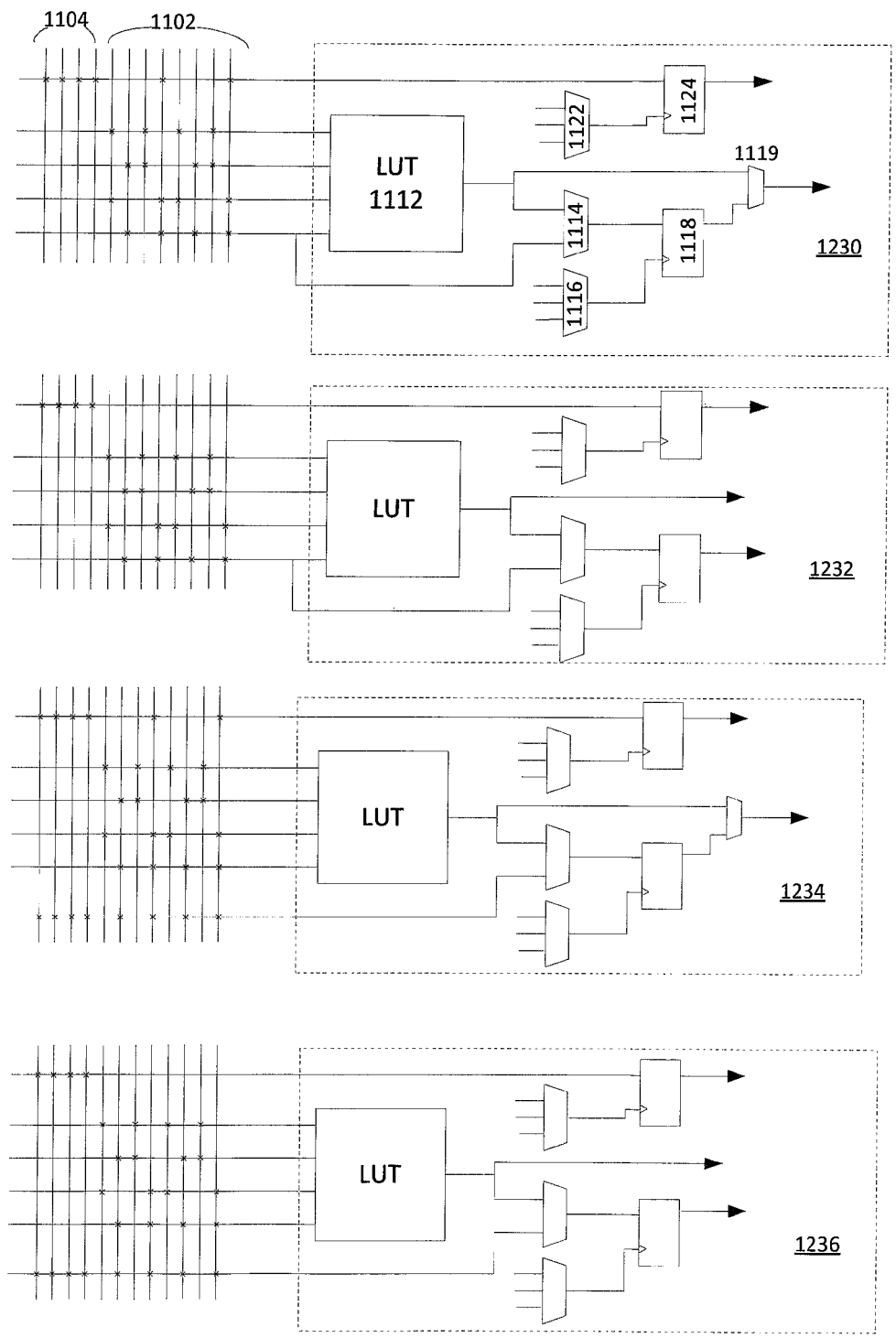
FIG. 12 show physical implementations of distinct logic and flip-flop resources in accordance with several embodiments of the invention.

While FIGS. 11A and 11B show a logical view of distinct LEs and FF elements, FIG. 12 shows physical implementations of the distinct LE and FF elements in accordance with several embodiments of the invention. As shown in FIG. 12, a plurality of circuit modules (1230, 1232, 1234 and 1236) may each include the circuitry of both a LE (1130, 1132, 1134 or 1136) which receives inputs from a first set of LAB lines 1102 and a FF element (1140, 1142 and 1144) which receives inputs from a second set of LAB lines 1104. As shown there are variations of input connectivity which may be different for each circuit module.

Figure 13:
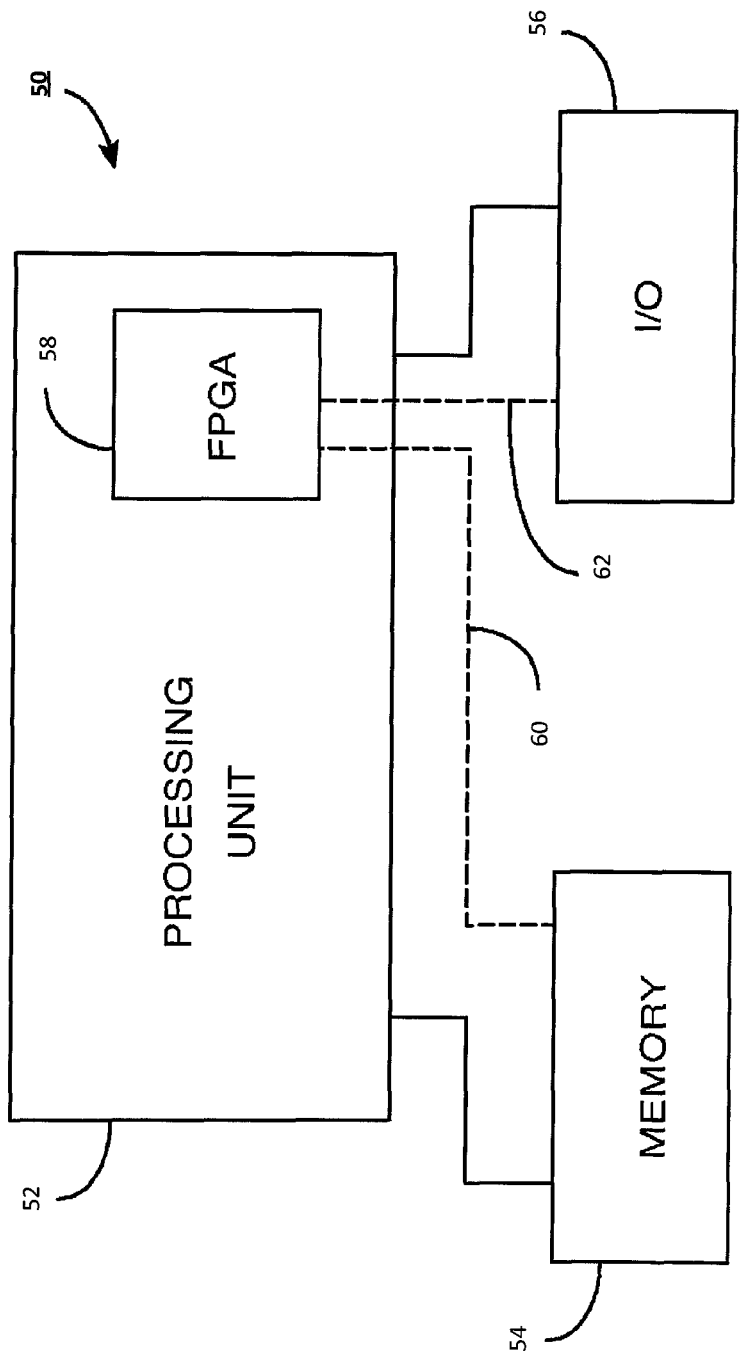
FIG. 13 shows a block diagram of an exemplary digital system that may employ circuitry and methods disclosed herein.

FIG. 13 is a block diagram of an exemplary digital system 50 that may employ circuitry and methods disclosed herein. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A method for pipelined direct-drive routing in a programmable logic device, the method comprising:
    programming a mode multiplexer to a pipeline mode, the mode multiplexer comprising a first tri-state buffer, and the mode multiplexer having first and second inputs and an output;
    selecting the signal by a routing multiplexer, the routing multiplexer having multiple inputs and an output, wherein the output of the routing multiplexer is connected to the first input of the mode multiplexer;
    outputting the signal from the output of the routing multiplexer to an input of a flip-flop;
    delaying the signal by the flip-flop;
    outputting the signal from an output of the flip-flop to a second input of the mode multiplexer; and
    outputting the signal from the mode multiplexer to a driver circuit.

2. The method of claim 1, wherein said delaying depends on a clock signal received at a clock input of the flip-flop.

3. The method of claim 1, wherein the flip-flop is a member of a common pool of flip-flops that is shared by a plurality of routing multiplexers.

4. The method of claim 1, wherein the routing multiplexer comprises a driver input multiplexer in a routing fabric of the programmable logic device, and the output line comprises a routing wire.

5. The method of claim 1, wherein the routing multiplexer comprises a logic-array-block (LAB) input multiplexer in a routing fabric of the programmable logic device, and the output line comprises a LAB line.

6. The method of claim 1, wherein the mode multiplexer further comprises a second tri-state buffer.

7. The method of claim 6, further comprising:
    driving an output line using the driver circuit, wherein the outputs of the first and second tri-state buffers are connected to the input of the driver circuit.

8. The method of claim 1, wherein the routing multiplexer comprises a driver input multiplexer in a routing fabric of the programmable logic device, and the output line comprises a routing wire.

9. The method of claim 1, wherein the routing multiplexer comprises a logic-array-block (LAB) input multiplexer in a routing fabric of the programmable logic device, and the output line comprises a LAB line.

10. The method of claim 1, wherein the output of the routing multiplexer is directly connected to the input of the flip-flop.

11. A circuit for pipelined direct-drive routing in a programmable logic device, the circuit comprising:
    a routing multiplexer having multiple inputs and an output;
    a first tri-state buffer having an input and an output, wherein the input of the first tri-state buffer is connected to the output of the routing multiplexer at a storage node of the circuit;
    a second tri-state buffer having an input and an output, wherein the input of the second tri-state buffer is connected to the storage node; and
    a feed forward inverter having an input and an output, wherein the input of the feed forward inverter is connected to the storage node and the output of the feed-forward inverter is connected to the output of the second tri-state buffer.

12. The circuit of claim 11, further comprising:
    a programmable latch control circuit which receives a pulse signal and, if programmed in a pipeline mode, asserts a latch enable pulse to the first tri-state buffer.

13. The circuit of claim 11, further comprising:
    a driver circuit having an input and an output, wherein the input of the driver circuit is connected to the storage node.

14. The circuit of claim 11, wherein the routing multiplexer comprises a driver input multiplexer in a routing fabric of the programmable logic device, and the output line comprises a routing wire.

15. The circuit of claim 11, wherein the routing multiplexer comprises a logic-array-block (LAB) input multiplexer in a routing fabric of the programmable logic device, and the output line comprises a LAB line.

* * * * *